United States Patent
Kim

[11] Patent Number: 6,060,365
[45] Date of Patent: May 9, 2000

[54] METHOD FOR FABRICATING A BIPOLAR TRANSISTOR

[75] Inventor: Yong-Chan Kim, Chungcheongbuk-do, Rep. of Korea

[73] Assignee: LG Semicon Co., Ltd., Cheongju-Si, Rep. of Korea

[21] Appl. No.: 09/017,486

[22] Filed: Feb. 2, 1998

[30] Foreign Application Priority Data

Apr. 10, 1997 [KR] Rep. of Korea ..................... 97 13206

[51] Int. Cl.[7] .............................................. H01L 21/331
[52] U.S. Cl. .......................................... 438/357; 438/341
[58] Field of Search ................................. 438/357, 350, 438/341, 365, 366

[56] References Cited

U.S. PATENT DOCUMENTS

| | | | |
|---|---|---|---|
| 4,735,912 | 4/1988 | Kawakatsu | 438/362 |
| 4,851,362 | 7/1989 | Suzuki | 438/348 |
| 5,017,503 | 5/1991 | Shiba | 438/330 |
| 5,024,957 | 6/1991 | Harame et al. | 438/367 |
| 5,296,391 | 3/1994 | Sato et al. | 438/341 |
| 5,402,002 | 3/1995 | Meister et al. | 257/586 |
| 5,422,303 | 6/1995 | Klose et al. | 438/359 |
| 5,432,104 | 7/1995 | Sato | 438/366 |
| 5,504,018 | 4/1996 | Sato | 438/350 |
| 5,599,723 | 2/1997 | Sato | 438/320 |
| 5,804,486 | 9/1998 | Zambrano et al. | 438/309 |

*Primary Examiner*—Charles Bowers
*Assistant Examiner*—Evan Pert
*Attorney, Agent, or Firm*—Fleshner & Kim, LLP

[57] ABSTRACT

A method for fabricating a bipolar transistor improves the fast characteristics of the transistor at low operating voltages. An oxide film is formed on a semiconductor substrate, in which a buried layer is formed, and a floating poly base is formed on the oxide film. An insulating film is then formed on the entire surface of the semiconductor substrate including the floating poly base. The insulating film and the floating poly base are etched to define a base region and a collector region, and a first epitaxial layer is formed in the base and collector regions, with the first epitaxial layer having a smaller thickness than the oxide film. A second epitaxial layer is formed on the first epitaxial layer, and impurities are implanted into the second epitaxial layer in the base and collector regions. A second polysilicon layer is then formed on the second epitaxial layer in the base region, and electrodes are formed on the semiconductor surface.

28 Claims, 11 Drawing Sheets

METHOD FOR FABRICATING A BIPOLAR TRANSISTOR

BACKGROUND OF THE INVENTION

1. Field of the Invention

The present invention relates to a semiconductor device and, more particularly, to a method for fabricating a bipolar transistor that improves a fast characteristic of the transistor at low operating voltages.

2. Background of the Related Art

Generally, the fast characteristic of a semiconductor device is very important if the device is used in a high frequency semiconductor circuit. To achieve a fast characteristic, prior methods have reduced the size of the semiconductor device. To reduce the size of the semiconductor device, related art methods have been provided for selectively forming an epitaxial layer and a floating poly base. Such methods are intended to reduce junction capacitance between a base and a collector in a bipolar transistor, and also to reduce parasitic capacitance between them by forming a thick insulating film on the bottom of a floating poly base.

A related art method for fabricating a bipolar transistor will be described with reference to the accompanying drawings.

Figure 1A:
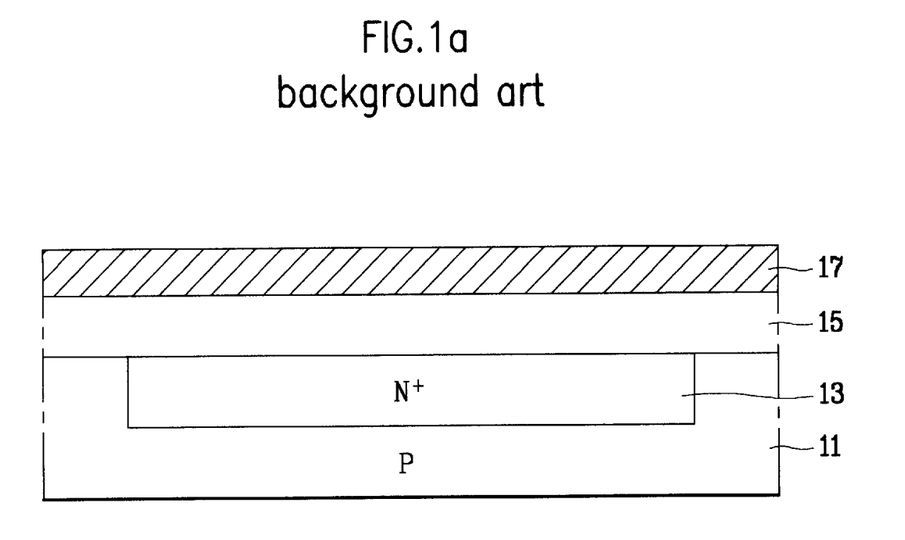
FIGS. 1a–1i are sectional views illustrating process steps of a related art method for fabricating a bipolar transistor.

FIG. 1a to FIG. 1i are sectional views illustrating process steps of a related art method for fabricating a bipolar transistor. As shown in FIG. 1a, an $N^+$conductive type buried layer 13 is formed in a P conductive type semiconductor substrate 11. A first oxide film 15 is formed on an entire surface of the semiconductor substrate 11 including the buried layer 13. A first polysilicon layer 17 is formed on the first oxide film 15.

Figure 1B:
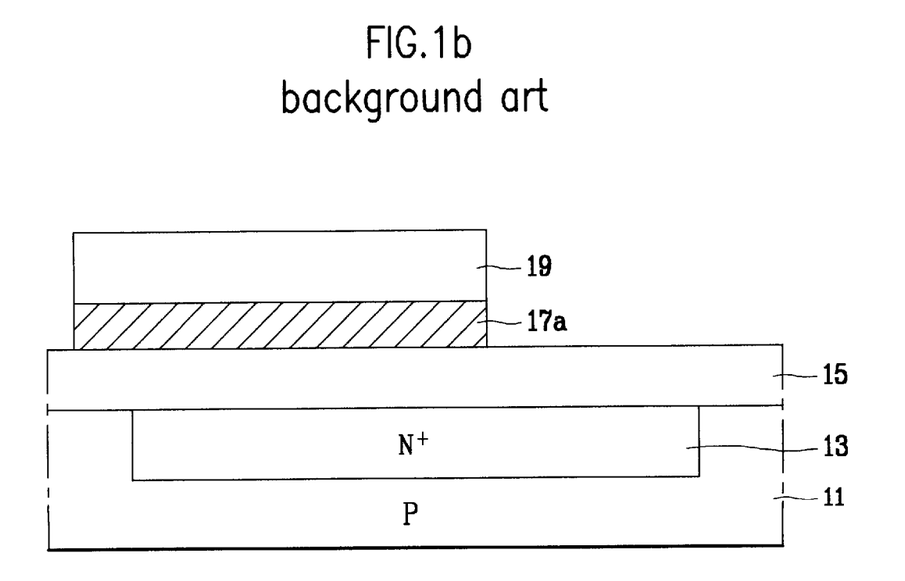

Subsequently, as shown in FIG. 1b, a photoresist 19 is deposited on the first polysilicon layer 17 and then patterned by exposure and developing processes. The first polysilicon layer 17 is selectively removed by an etching process using the patterned photoresist 19 as a mask to form a floating poly base 17a. The first oxide film 15 is formed thick to reduce parasitic capacitance between the floating poly base 17a and the buried layer 13.

Figure 1C:
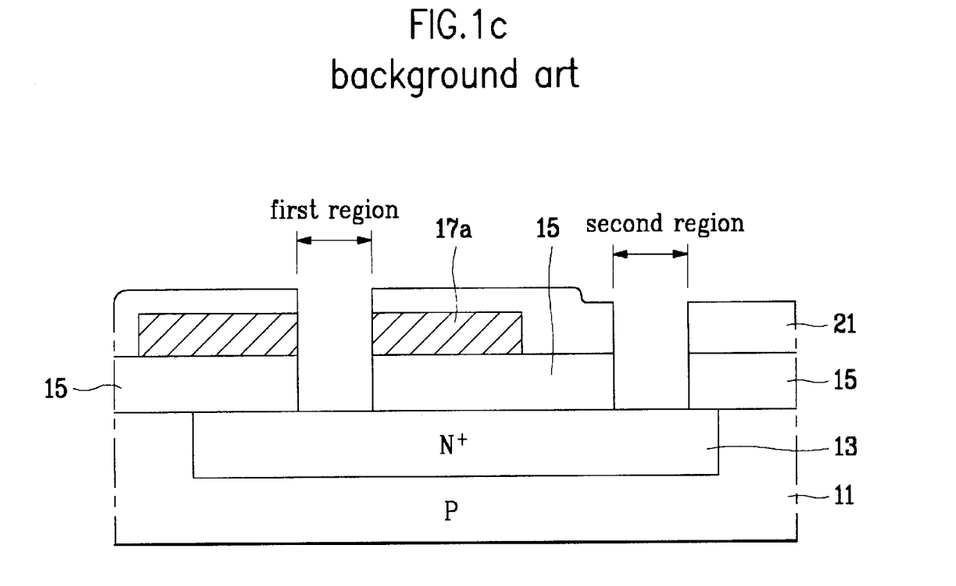

As shown in FIG. 1c, a first chemical vapor deposition (CVD) oxide film 21 is deposited on the entire surface of the semiconductor substrate 11, including the floating poly base 17a. A photoresist (not shown) is then deposited on the first CVD oxide film 21 and patterned by exposure and developing processes. The first CVD oxide film 21, the floating poly base 17a, and the first oxide film 15 are sequentially removed by an etching process using the patterned photoresist as a mask to define a first region and a second region. At this time, a surface of the buried layer 13 is exposed.

Figure 1D:
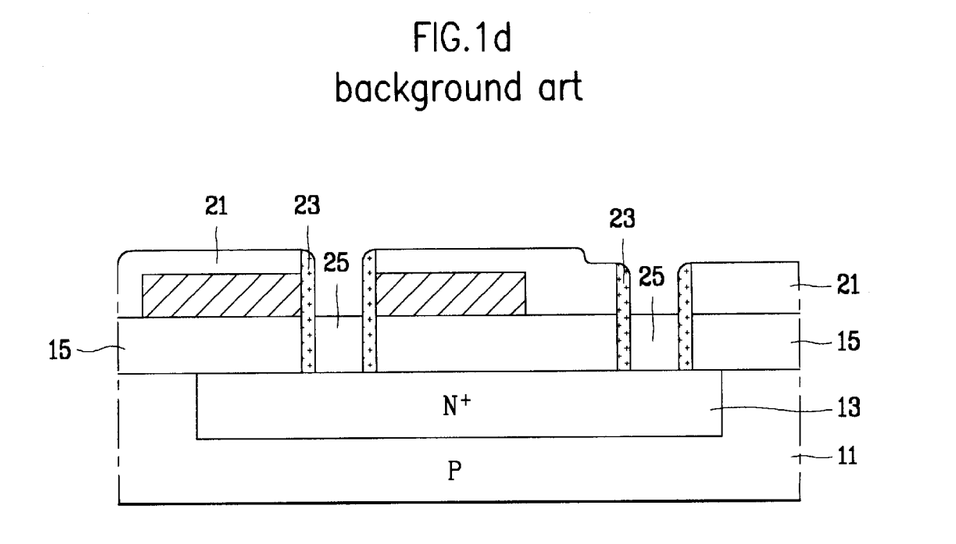

As shown in FIG. 1d, a second CVD oxide film is deposited on the entire surface of the semiconductor substrate 11, including the first CVD oxide film 21, and then etched back to form a first sidewall 23 on inner walls of the first and second regions. Thereafter, a first epitaxial layer 25 is epitaxially grown by using the buried layer 13 as a seed.

Figure 1E:
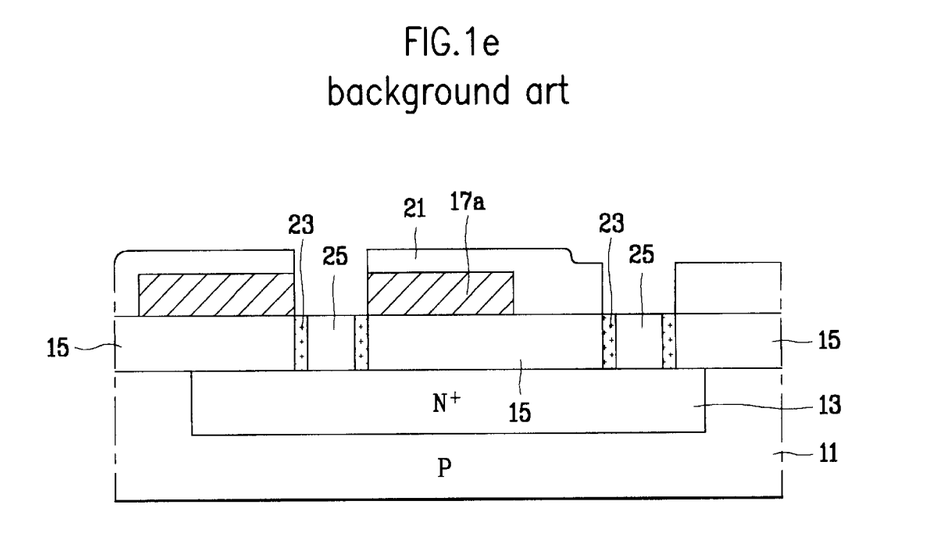
Figure 1F:
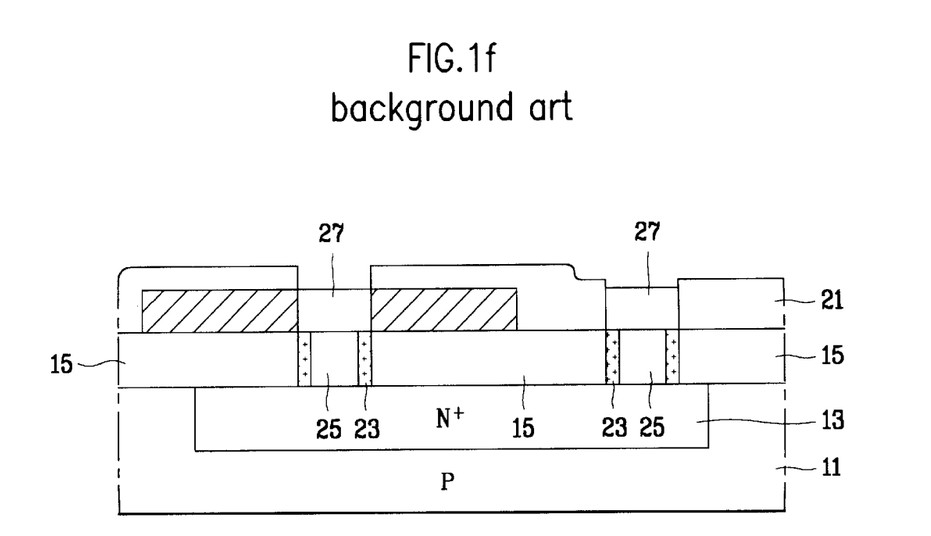

As shown in FIG. 1e, the first sidewall 23, which is formed on the sides of the floating poly base 17a and the first CVD oxide film 21 in the first and second regions, is partially removed. As shown in FIG. 1f, the first epitaxial layer 25 in the first and second regions is used as a seed to epitaxially grow a second epitaxial layer 27 having the same height as the floating poly base 17a.

Figure 1G:
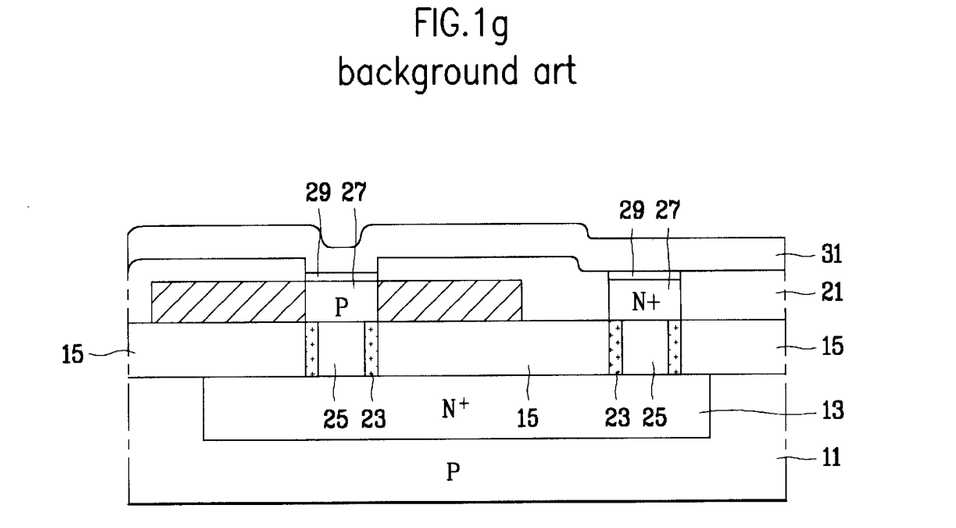

As shown in FIG. 1g, a buffer oxide film 29 is grown on the second epitaxial layer 27 in the first and second regions.

The buffer oxide film 29 serves as a buffer during ion implantation. P conductive type impurity ions are implanted into the second epitaxial layer 27 in the first region and $N^+$conductive type impurity ions are implanted into the second epitaxial layer 27 in the second region. Then, the second epitaxial layer 27 in the first region is used as a base and the second epitaxial layer 27 in the second region is used as a collector contact region. Subsequently, a third CVD oxide film 31 is formed on the entire surface of the semiconductor substrate 11 including the second epitaxial layer 27.

Figure 1H:
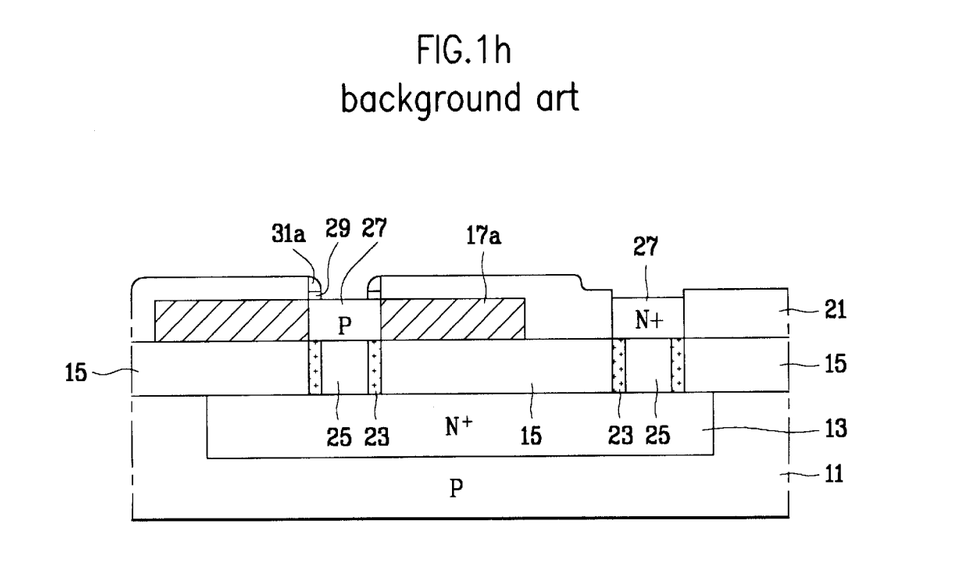

As shown in FIG. 1h, the third CVD oxide film 31 is etched back to form a second sidewall 31a on the sides of the first CVD oxide film 21. The buffer oxide film 29 is then etched using the second sidewall 31a as a mask to expose the second epitaxial layer 27 in the first region, into which the P conductive type impurity ions are implanted.

Figure 1I:
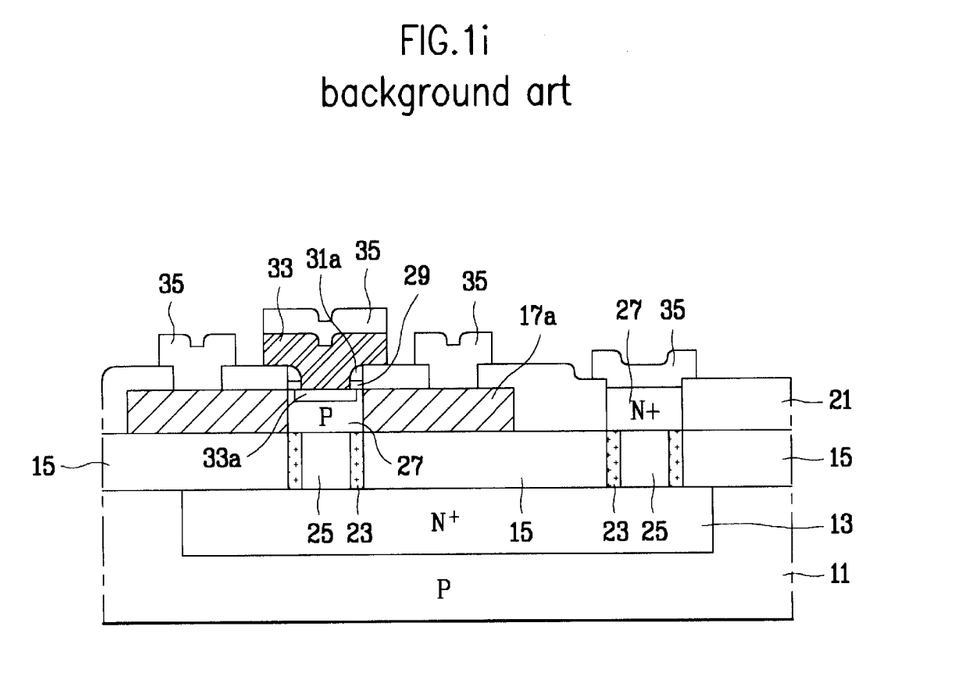

As shown in FIG. 1i, a second polysilicon layer is formed on the entire surface of the semiconductor substrate 11 including the exposed second epitaxial layer 27. The second polysilicon layer is then selectively removed to form an emitter poly 33 which contacts the epitaxial layer 27 in the first region. The emitter poly 33 includes polysilicon that is doped with impurities. The impurities are diffused into the second epitaxial layer 27 so that emitter junction 33a is formed. Subsequently, the first CVD oxide film 21 is selectively removed to expose the surface of the floating poly base 17a on both sides of the second epitaxial layer 27. A metal is deposited on the entire surface and then patterned to form an electrode pattern 35. This completes the related art method for fabricating a bipolar transistor.

As discussed above, the related art method for fabricating a bipolar transistor selectively grows the epitaxial layer and the floating poly base to reduce the junction capacitance between the base and the collector. The related art method also reduces parasitic capacitance between the base and the collector by forming a thick insulating film on the bottom of the floating poly base.

However, the related art method for fabricating a bipolar transistor has several problems. One problem is that the thickness of the epitaxial layer is the same as the thickness of the thick insulating film formed on the bottom of the floating poly base. The unnecessarily thick epitaxial layer reduces the fast characteristics of the semiconductor device during low voltage operation.

SUMMARY OF THE INVENTION

Accordingly, the present invention is directed to a method for fabricating a bipolar transistor that substantially obviates the problems associated with related art methods.

An object of the present invention is to provide a method for fabricating a bipolar transistor that improves the fast characteristics of a semiconductor device by forming a thin epitaxial layer, even if a thick insulating film is formed on the bottom of a floating poly base.

The present invention may be achieved in whole or in part by a method for fabricating a bipolar transistor, comprising the steps of: (1) forming an oxide film on a semiconductor substrate in which a buried layer is formed; (2) forming a floating poly base on the semiconductor substrate; (3) forming an insulating film on the entire surface of the semiconductor substrate, including the floating poly base; (4) selectively removing portions of the insulating film and the floating poly base to define a base region and a collector region; (5) forming a first epitaxial layer in the base and collector regions, the first epitaxial layer having a thickness that is smaller than the thickness of the oxide film; forming a second epitaxial layer on the first epitaxial layer; (6) implanting impurities into the second epitaxial layer in the base and collector regions; (7) forming a second polysilicon layer on the second epitaxial layer in the base region; and (8) forming electrodes on the semiconductor surface.

The present invention may also be achieved in whole or in part by a method for fabricating a bipolar transistor, comprising the steps of: (1) forming an oxide film on a semiconductor substrate in which a buried layer is formed; (2) forming a first polysilicon layer on an entire surface of the semiconductor substrate including the oxide film; (3) selectively removing portions of the first polysilicon layer to form a floating poly base; (4) forming an insulating film on the entire surface of the semiconductor substrate including the floating poly base; (5) selectively removing portions of the insulating film and the floating poly base to define a base region and a collector region; (6) forming a first epitaxial layer in the base and collector regions after forming a first sidewall on sides of the oxide film, sides of the floating poly base and sides of the insulating film, the first epitaxial layer having a thickness that is smaller than the thickness of the oxide film; (7) forming a second epitaxial layer on the first epitaxial layer after removing a portion of the first sidewall, wherein the second epitaxial layer is formed higher than the first epitaxial layer; (8) implanting impurities into the second epitaxial layer in the base and collector regions; (9) forming a second polysilicon layer on the second epitaxial layer in the base region after forming a second sidewall on exposed sides of the insulating film; (10) depositing a metal on the entire semiconductor surface; and (11) selectively removing portions of the metal to form electrode patterns.

The present invention may also be achieved in whole or in part by a method for fabricating a bipolar transistor, comprising the steps of: (1) sequentially forming a first insulating film and a second insulating film on a semiconductor substrate in which a buried layer is formed; (2) selectively removing portions of the first and second insulating films to define regions on the semiconductor substrate for formation of an oxide film; (3) forming an oxide film in the defined regions of the semiconductor substrate; (4) removing the second insulating film; (5) forming a first polysilicon layer on an entire surface of the semiconductor substrate; (6) selectively removing portions of the first polysilicon layer to form a floating poly base; (7) forming a third insulating film on the entire surface of the semiconductor substrate including the floating poly base; (8) selectively removing portions of the insulating film and the floating poly base to define a base region and a collector region and to expose the buried layer at the base region and the collector region; (9) forming a first sidewall on sides of the oxide film, sides of the third insulating film, and sides of the floating poly base in the base and collector regions; (10) forming a first epitaxial layer in the base and collector regions using the exposed buried layer as a seed; (11) forming a second epitaxial layer on the first epitaxial layer after removing a sidewall portion over the first epitaxial layer; (12) forming a fourth insulating film on the second epitaxial layer; (12) implanting impurities into the base and collector regions; (13) forming a second sidewall on a side of the third insulating film layer; (14) selectively removing portions of the fourth insulating film using the second sidewall as a mask; (15) forming a second polysilicon layer on the entire surface of the semiconductor substrate; (16) selectively removing portions of the second polysilicon layer to form an emitter poly; (17) selectively removing portions of the third insulating film to expose the floating poly base; (18) depositing a metal on the entire semiconductor surface; and (19) selectively removing portions of the metal to form electrodes.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings.

Figure 2A:
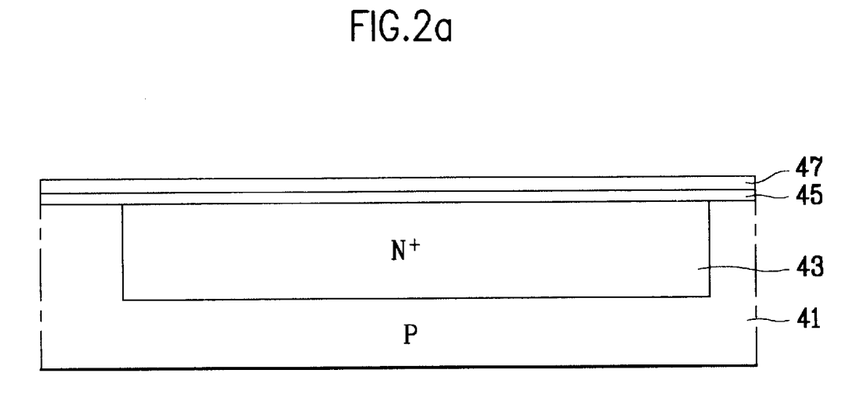
FIGS. 2a–2k are sectional views illustrating process steps of a method for fabricating a bipolar transistor according to the present invention.

FIGS. 2a–2k are sectional views illustrating process steps of a preferred embodiment of a method for fabricating a bipolar transistor according to the present invention. As shown in FIG. 2a, an $N^+$ conductive type buried layer 43 is formed in a surface of a P conductive type semiconductor substrate 41. A first insulating film 45 is formed on the semiconductor substrate 41 in which the $N^+$ conductive type buried layer 43 is formed. A second insulating film 47 is then formed on the first insulating film 45. The first insulating film 45 is preferably a silicon oxide film having a thickness of several hundred angstroms. The second insulating film 47 is preferably a silicon nitride film having a thickness of 1000–2000 Å.

Figure 2B:
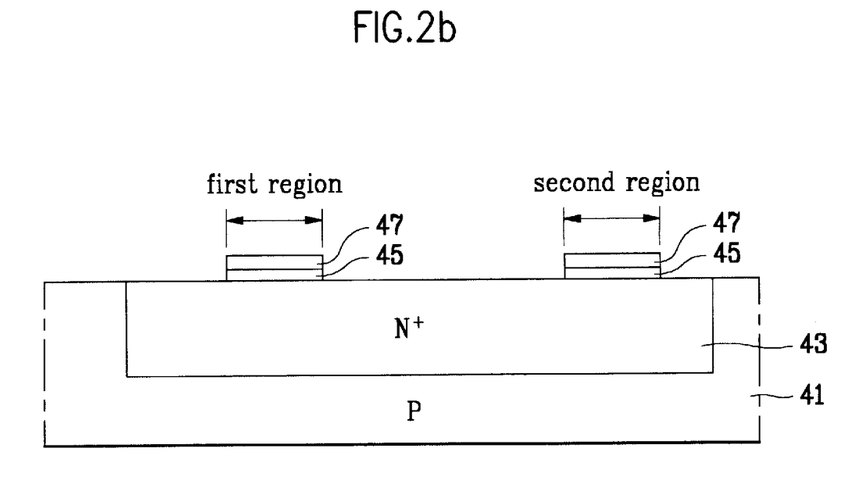

Subsequently, as shown in FIG. 2b, a photoresist (not shown) is deposited on the second insulating film 47 and then patterned by exposure and developing processes. The second insulating film 47 and the first insulating film 45 are selectively removed by an etching process using the patterned photoresist as a mask. The semiconductor substrate 41 is then partially exposed for local oxidation. The remaining first and second insulating films 45 and 47 form first and second regions.

Figure 2C:
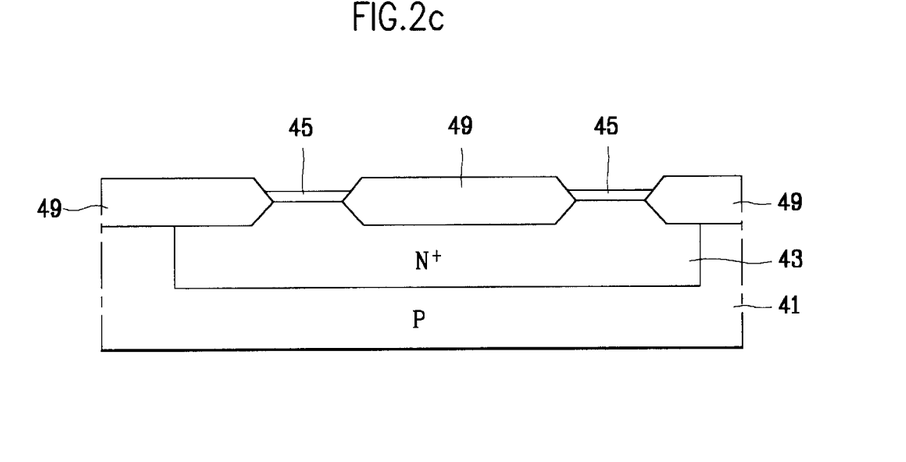

As shown in FIG. 2c, the semiconductor substrate 41, which is partially exposed, is oxidized so that an oxide film 49 is selectively grown on the exposed portions of the semiconductor substrate 41. At this time, the oxide film 49 has a thickness of approximately 1.0 μm. Then, the remaining second insulating film 47 is removed.

Figure 2D:
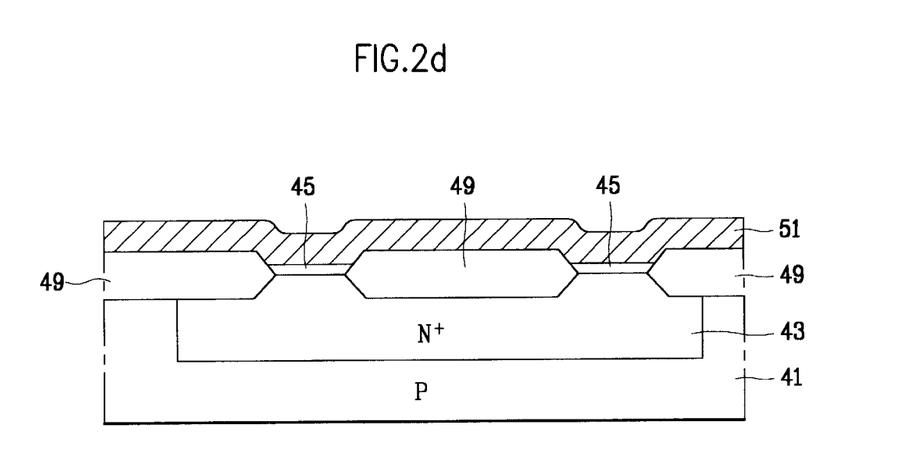
Figure 2E:
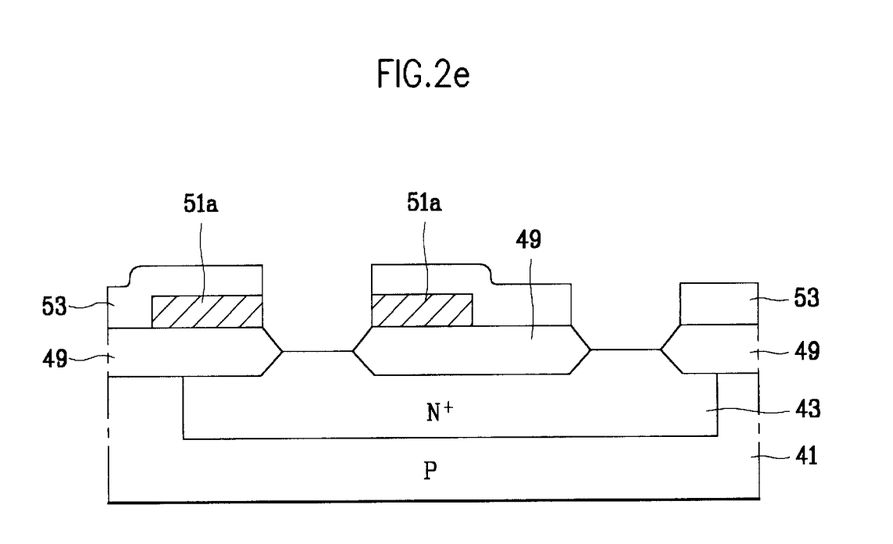

Thereafter, as shown in FIG. 2d, a first polysilicon layer 51 is formed on the entire surface of the semiconductor substrate 41 including the oxide film 49. The first polysilicon layer 51 can be used as a floating poly base. A photoresist (not shown) is deposited on the first polysilicon layer 51 and then patterned by exposure and developing processes. The first polysilicon layer 51 is selectively removed by an etching process using the patterned photoresist as a mask, thereby forming a floating poly base 51a as shown in FIG. 2e. At this time, a floating poly base is not formed in the second region.

A third insulating film 53 is formed on the entire surface of the semiconductor substrate 41, including the floating poly base 51a. Subsequently, the third insulating film the floating poly base 51a, and the first insulating film 45 in the first region are etched to expose a surface of the N+conductive type buried layer 43. The third insulating film 53 and the first insulating film 45 in the second region are also removed to expose the N+conductive type buried layer 43.

Figure 2F:
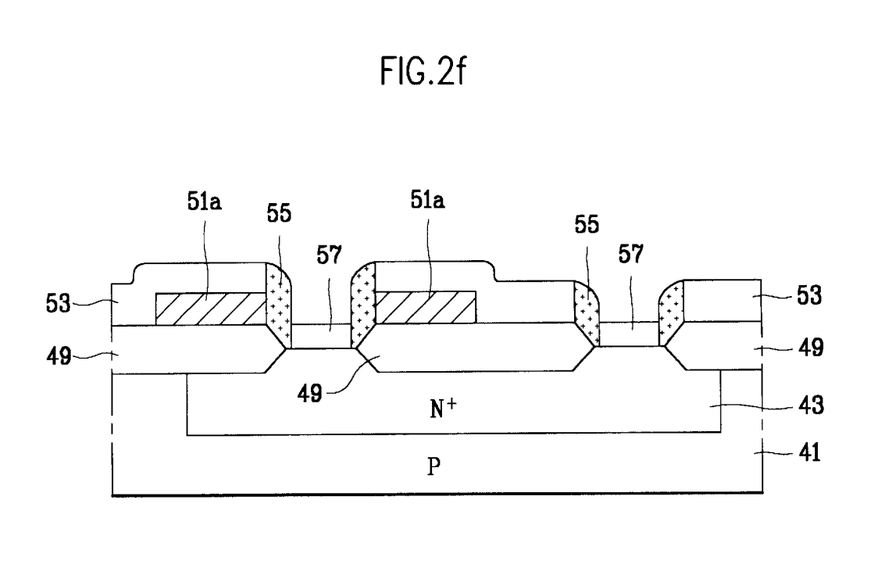

As shown in FIG. 2f, a fourth insulating film is formed on the entire surface of the semiconductor substrate 41, including the exposed N+conductive type buried layer 43. The fourth insulating film is then etched back to form a sidewall 55 on the sides of the oxide film 49, the floating poly base 51a, and the third insulating film 53 in the first region. The sidewall 55 is also formed on the sides of the oxide film 49 and the third insulating film 53 in the second region. A first epitaxial layer 57 is epitaxially grown using the exposed N+conductive type buried layer 43 as a seed. At this time, the first epitaxial layer 57 is grown to the height of the oxide film 49, i.e., to the bottom of the floating poly base 51a.

Figure 2G:
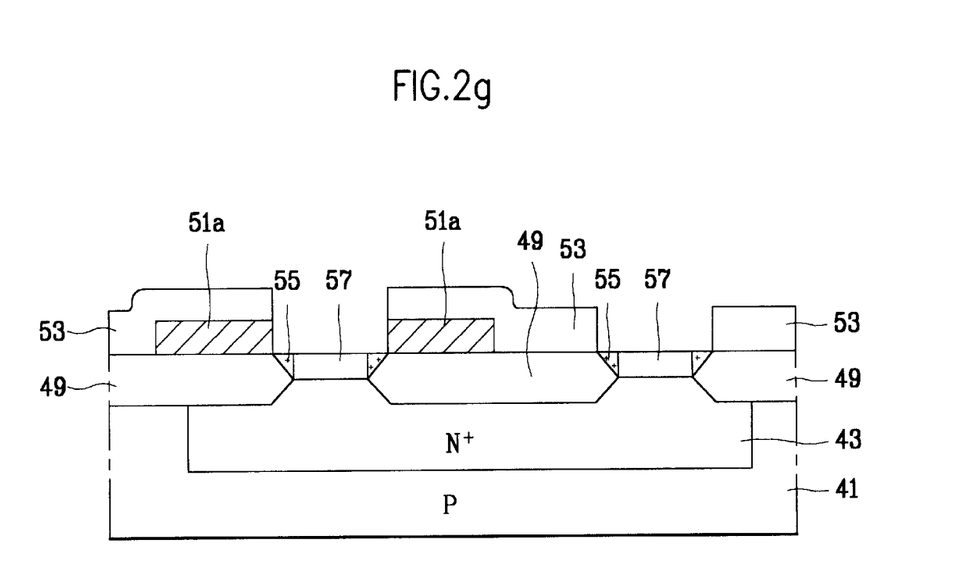
Figure 2H:
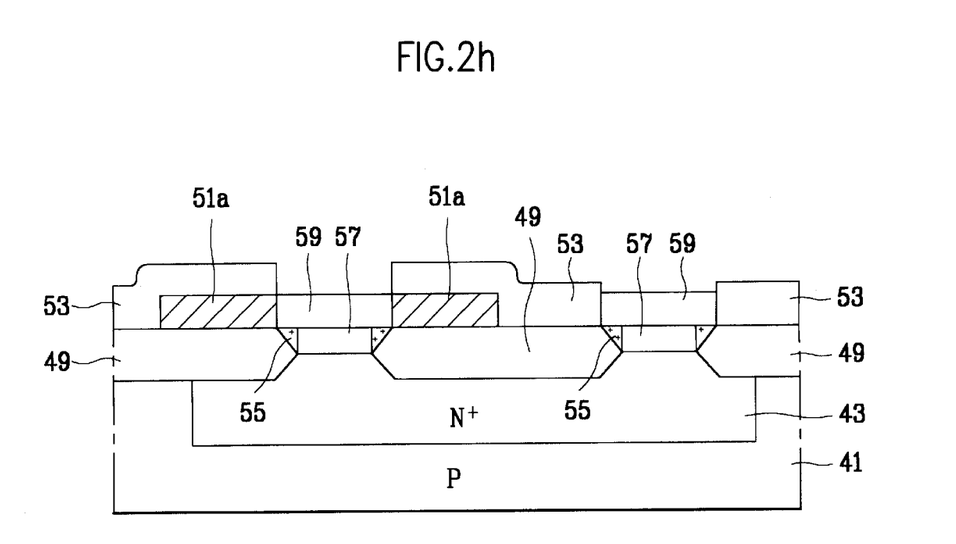

Subsequently, as shown in FIG. 2g, the sidewall 55 on the sides of the floating poly base 51a and the third insulating film 53 in the first region is removed. In the same manner, the sidewall 55 on the sides of the third insulating film 53 in the second region is removed. As shown in FIG. 2h, a second epitaxial layer 59 is epitaxially grown using the first epitaxial layer 57 as a seed. At this time, the second epitaxial layer 59 in the first and second regions is grown to the height of the floating poly base 51a.

Figure 2I:
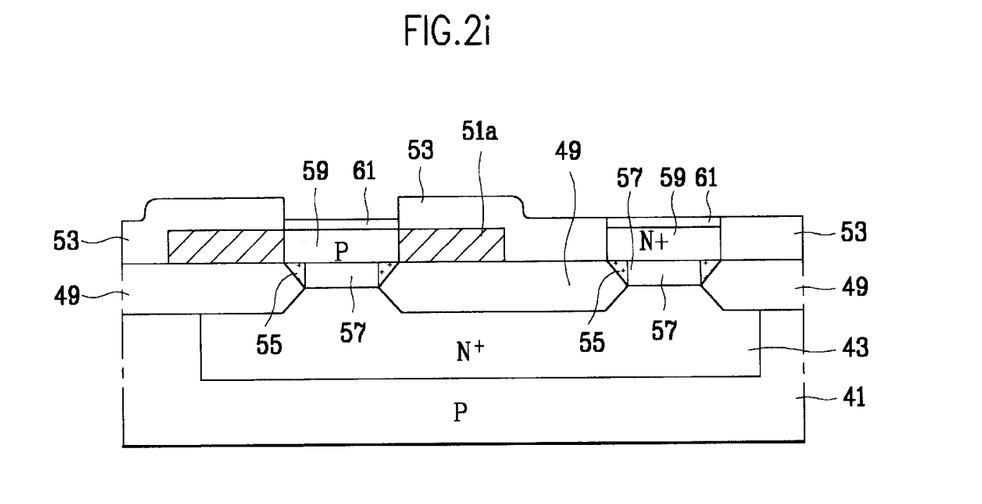

As shown in FIG. 2i, a buffer oxide film 61 is grown on the second epitaxial layer 59. The buffer oxide film 61 serves as a buffer during ion implantation. P conductive type impurity ions are implanted into the second epitaxial layer 59 of the first region and N+ conductive type impurity ions are implanted into the second epitaxial layer 59 of the second region. Then, the second epitaxial layer 59 of the first region is used as a base and the second epitaxial layer 59 of the second region is used as a collector contact region.

Figure 2J:
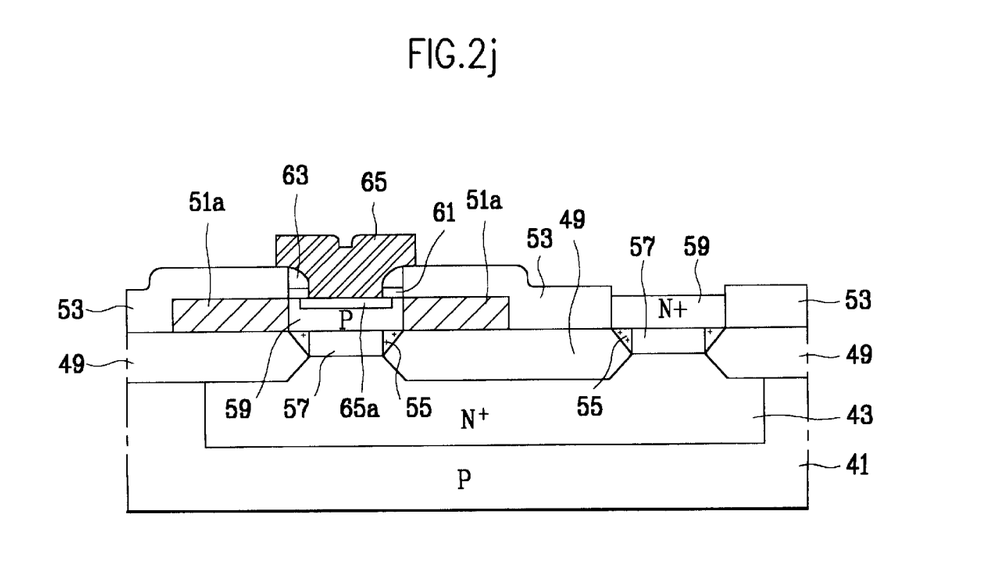

As shown in FIG. 2j, a sixth insulating film is formed on the entire surface of the semiconductor substrate 41, including the second epitaxial layer 59 into which the impurity ions are implanted. The sixth insulating film is then etched back to form a sidewall 63 on the sides of the third insulating film 53 by step coverage between the buffer oxide film 61 and the third insulating film 53. The buffer oxide film 61 is etched using the sidewall 63 as a mask to expose the second epitaxial layer 59 of the first region into which the P conductive type impurity ions are implanted. At the same time, the buffer oxide film 61 of the second region is etched.

Thereafter, a second polysilicon layer is formed on the entire surface of the semiconductor substrate 41, including the exposed second epitaxial layer 59. A photoresist (not shown) is deposited on the second polysilicon layer and patterned. The second polysilicon layer is then selectively removed by an etching process using the patterned photoresist as a mask, thereby forming an emitter poly 65 that contacts the epitaxial layer 59 in the first region. The emitter poly 65 includes polysilicon that is doped with impurities. The impurities are diffused into the second epitaxial layer 59 so that an emitter junction 65a is formed.

Figure 2K:
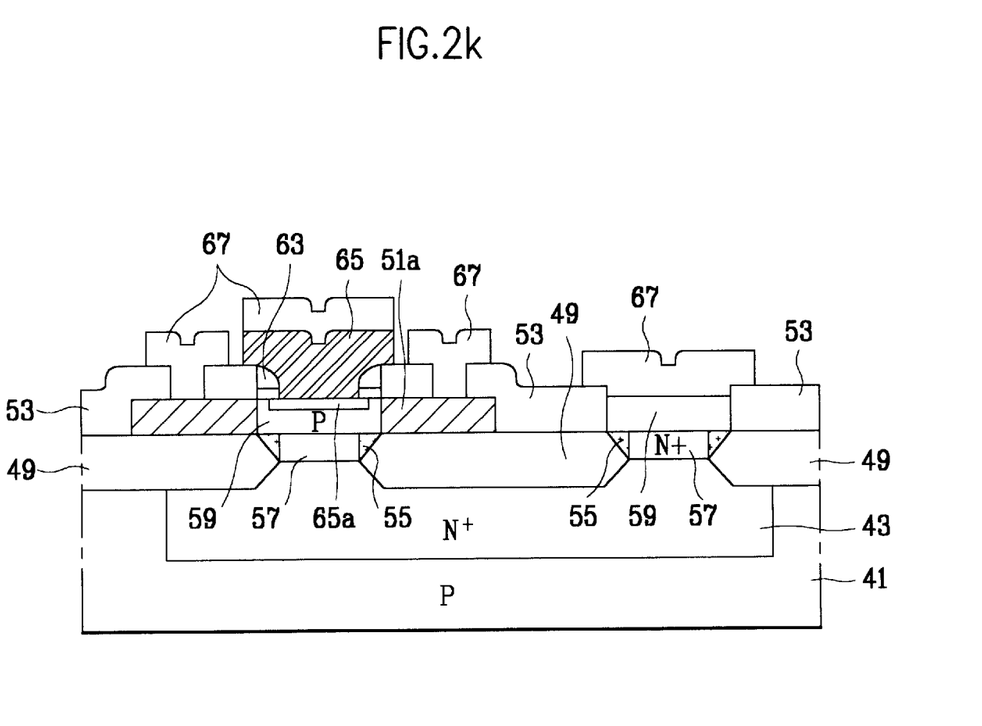

Subsequently, as shown in FIG. 2k, the third insulating film 53 on the floating poly base 51a is selectively removed. A metal is deposited on the entire surface of the semiconductor substrate 41, including the emitter poly 65 and patterned to form electrode patterns 67. This completes the fabrication method of the preferred embodiment.

As discussed above, the preferred embodiment of the method of fabricating a bipolar transistor according to the present invention has various advantages. Since the oxide film 49 is formed on the bottom of the floating poly base 51a by local oxidation, it is possible to form a thin epitaxial layer 57. This improves the fast characteristics of the semiconductor device during low voltage operation.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A method for fabricating a bipolar transistor, comprising the steps of:

forming an oxide film with tapered ends on a semiconductor substrate in which a buried layer is formed;

forming a floating poly base on the semiconductor substrate;

forming an insulating film on the entire surface of the semiconductor substrate, including the floating poly base;

selectively removing portions of the insulating film and the floating poly base to define a base region and a collector region;

forming a first epitaxial layer having an upper surface in the base and collector regions, the first epitaxial layer having a thickness that is less than maximum thickness of the oxide film;

forming a second epitaxial layer on the first epitaxial layer;

implanting impurities into the second epitaxial layer in the base and collector regions;

forming a second polysilicon layer on the second epitaxial layer in the base region; and forming electrodes on the semiconductor surface.

2. The method for fabricating a bipolar transistor as claimed in claim 1, wherein the first epitaxial layer is formed such that the upper surface of the first epitaxial layer is substantially level with the oxide film top surface and the second epitaxial layer is formed to substantially the same height as the floating poly base.

3. The method for fabricating a bipolar transistor as claimed in claim 1, wherein P conductive type impurities are implanted into the second epitaxial layer in the base region and N conductivity type impurities are implanted into the second epitaxial layer in the collector region.

4. The method for fabricating a bipolar transistor as claimed in claim 1, wherein the step of forming the oxide film comprises the steps of:

sequentially forming a first insulating film and a second insulating film on the entire surface of the semiconductor substrate in which the buried layer is formed;

selectively removing portions of the second and first insulating films to define regions for the formation of the oxide film; and forming the oxide film by local oxidation of silicon.

5. The method for fabricating a bipolar transistor as claimed in claim 1, wherein the step of forming a floating poly base comprises the steps of:

forming a first polysilicon layer on the entire surface of the semiconductor substrate including the oxide film;

depositing a photoresist on the first polysilicon layer and patterning the photoresist by exposure and developing processes; and selectively removing portions of the first polysilicon layer by an etching process using the patterned photoresist as a mask.

6. The method for fabricating a bipolar transistor as claimed in claim 1, wherein the semiconductor substrate is of a conductivity type that is opposite to a conductivity type of the buried layer.

7. The method for fabricating a bipolar transistor as claimed in claim 1, wherein the first epitaxial layer is epitaxially grown using the buried layer as a seed and the second epitaxial layer is epitaxially grown using the first epitaxial layer as a seed.

8. The method for fabricating a bipolar transistor as claimed in claim 1, wherein the second polysilicon layer comprises silicon doped with impurities.

9. The method for fabricating a bipolar transistor as claimed in claim 1, wherein the oxide film is formed by local oxidation of silicon.

10. A method for fabricating a bipolar transistor, comprising the steps of:

forming an oxide film with tapered ends on a semiconductor substrate in which a buried layer is formed;

forming a first polysilicon layer on an entire surface of the semiconductor substrate including the oxide film;

selectively removing portions of the first polysilicon layer to form a floating poly base;

forming an insulating film on the entire surface of the semiconductor substrate including the floating poly base;

selectively removing portions of the insulating film and the floating poly base to define a base region and a collector region;

forming a first epitaxial layer having an upper surface in the base and collector regions after forming a first sidewall on the tapered ends of the oxide film, sides of the floating poly base and sides of the insulating film, the first epitaxial layer having a thickness that is less than a maximum thickness of the oxide film;

forming a second epitaxial layer on the first epitaxial layer after removing a portion of the first sidewall, wherein the second epitaxial layer is formed higher than the first epitaxial layer;

implanting impurities into the second epitaxial layer in the base and collector regions;

forming a second polysilicon layer on the second epitaxial layer in the base region after forming a second sidewall on exposed sides of the insulating film;

depositing a metal on the entire semiconductor surface; and selectively removing portions of the metal to form electrode patterns.

11. The method for fabricating a bipolar transistor as claimed in claim 10, wherein the first epitaxial layer is formed such that the upper surface of the first epitaxial layer is substantially level with the oxide film top surface and the second epitaxial layer is formed to substantially the same height as the floating poly base.

12. The method for fabricating a bipolar transistor as claimed in claim 10, wherein P conductive type impurities implanted into the second epitaxial layer in the base region and N conductive type impurities implanted into the second epitaxial layer in the collector region.

13. The method for fabricating a bipolar transistor as claimed in claim 10, wherein the step of forming the oxide film comprises the steps of:

sequentially forming a first insulating film and a second insulating film on the entire surface of the semiconductor substrate in which the buried layer is formed;

selectively removing portions of the second and first insulating films to define regions for the formation of the oxide film; and forming the oxide film by local oxidation of silicon.

14. The method for fabricating a bipolar transistor as claimed in claim 10, wherein the step of forming a floating poly base comprises the steps of:

forming a first polysilicon layer on the entire surface of the semiconductor substrate, including the oxide film;

depositing a photoresist on the first polysilicon layer and patterning the photoresist by exposure and developing processes; and selectively removing portions of the first polysilicon layer by an etching process using the patterned photoresist as a mask.

15. The method for fabricating a bipolar transistor as claimed in claim 10, wherein the semiconductor substrate is of a conductivity type that is opposite to a conductivity type of the buried layer.

16. The method for fabricating a bipolar transistor as claimed in claim 10, wherein the first epitaxial layer is epitaxially grown using the buried layer as a seed and the second epitaxial layer is epitaxially grown using the first epitaxial layer as a seed.

17. The method for fabricating a bipolar transistor as claimed in claim 10, wherein the second polysilicon layer comprises silicon doped with impurities.

18. The method for fabricating a bipolar transistor as claimed in claim 10, wherein the oxide film is formed by local oxidation of silicon.

19. A method for fabricating a bipolar transistor, comprising the steps of:

sequentially forming a first insulating film and a second insulating film on a semiconductor substrate in which a buried layer is formed;

selectively removing portions of the first and second insulating films to define regions on the semiconductor substrate for formation of an oxide film;

forming an oxide film in the defined regions of the semiconductor substrate, wherein the oxide film has tapered ends, removing the second insulating film;

forming a first polysilicon layer on an entire surface of the semiconductor substrate;

selectively removing portions of the first polysilicon layer to form a floating poly base;

forming a third insulating film on the entire surface of the semiconductor substrate including the floating poly base;

selectively removing portions of the first insulating film, the third insulating film and the floating poly base to define a base region and a collector region and to expose the buried layer at the base region and the collector region;

forming a first sidewall on sides of the oxide film, sides of the third insulating film, and sides of the floating poly base in the base and collector regions;

forming a first epitaxial layer having an upper surface in the base and collector regions using the exposed buried layer as a seed wherein a thickness of the first epitaxial layer is less than the maximum thickness of the oxide film;

forming a second epitaxial layer on the first epitaxial layer after removing a sidewall portion over the first epitaxial layer;

forming a fourth insulating film on the second epitaxial layer;

implanting impurities into the base and collector regions;

forming a second sidewall on a side of the third insulating film;

selectively removing portions of the fourth insulating film using the second sidewall as a mask;

forming a second polysilicon layer on the entire surface of the semiconductor substrate;

selectively removing portions of the second polysilicon layer to form an emitter poly;

selectively removing portions of the third insulating film to expose the floating poly base;

depositing a metal on the entire semiconductor surface; and selectively removing portions of the metal to form electrodes.

20. The method for fabricating a bipolar transistor as claimed in claim 19, wherein the first insulating film is formed of silicon oxide and the second insulating film is formed of silicon nitride.

21. The method for fabricating a bipolar transistor as claimed in claim 19, wherein the impurities implanted into the base region are P conductive type and the impurities implanted into the collector region are N conductive type.

22. The method for fabricating a bipolar transistor as claimed in claim 19, wherein the second polysilicon layer is doped with impurities.

23. The method for fabricating a bipolar transistor as claimed in claim 19, wherein the first sidewall prevents the first epitaxial layer from growing on the floating poly base.

24. The method for fabricating a bipolar transistor as claimed in claim 19, wherein the first epitaxial layer in the base region is N conductive type and the second epitaxial layer in the base region is P conductive type.

25. The method for fabricating a bipolar transistor as claimed in claim 19, wherein the first and second epitaxial layers in the collector region are N conductive type.

26. The method for fabricating a bipolar transistor as claimed in claim 19, wherein the first epitaxial layer is grown such that the upper surface of the first epitaxial layer is substantially level with the oxide film top surface and the second epitaxial layer is grown to the height of the floating poly base.

27. The method for fabricating a bipolar transistor as claimed in claim 19, wherein the semiconductor substrate is P conductive type and the buried layer is N conductive type.

28. The method for fabricating a bipolar transistor as claimed in claim 19, wherein the oxide film is formed by local oxidation of silicon.

* * * * *